(12) United States Patent
Qiu et al.

(10) Patent No.: US 10,262,864 B2
(45) Date of Patent: Apr. 16, 2019

(54) POINT-OF-USE ENRICHMENT OF GAS MIXTURES FOR SEMICONDUCTOR STRUCTURE FABRICATION AND SYSTEMS FOR PROVIDING POINT-OF-USE ENRICHMENT OF GAS MIXTURES

(71) Applicant: SUNPOWER CORPORATION, San Jose, CA (US)

(72) Inventors: Taiqing Qiu, Los Gatos, CA (US); Glyn Jeremy Reynolds, Cupertino, CA (US); Xiao Bai, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 50 days.

(21) Appl. No.: 15/395,128

(22) Filed: Dec. 30, 2016

(65) Prior Publication Data

US 2018/0190492 A1    Jul. 5, 2018

(51) Int. Cl.
| | | |
|---|---|---|
| *H01L 21/223* | (2006.01) | |
| *C09D 5/24* | (2006.01) | |
| *B01D 53/32* | (2006.01) | |
| *B01D 53/22* | (2006.01) | |
| *H01L 31/18* | (2006.01) | |

(52) U.S. Cl.
CPC ............ *H01L 21/223* (2013.01); *B01D 53/22* (2013.01); *B01D 53/326* (2013.01); *C09D 5/24* (2013.01); *H01L 31/184* (2013.01); *H01L 31/1804* (2013.01)

(58) Field of Classification Search
CPC ..................................................... B01D 59/38
See application file for complete search history.

(56) References Cited

U.S. PATENT DOCUMENTS

| | | |
|---|---|---|
| 2,862,575 A | 12/1958 | Birdwhistell et al. |
| 2,911,057 A | 11/1959 | Green et al. |
| 2,966,235 A | 12/1960 | Kammermeyer |
| 3,274,750 A | 9/1966 | Robb |
| 3,475,302 A | 10/1969 | Langer et al. |
| 4,119,417 A | 10/1978 | Heki et al. |

(Continued)

OTHER PUBLICATIONS

Cheng, Fangyi, et al., "Ni 1-x Pt x ( x=0-0.12) Hollow Spheres as Catalysts for Hydrogen Generation from Ammonia Borane", Inorganic Chemistry, Mar. 2007, 788-794.

(Continued)

*Primary Examiner* — Angel Roman
(74) *Attorney, Agent, or Firm* — Schwabe, Williamson & Wyatt, P.C.

(57) ABSTRACT

Point-of-use enrichment of gas mixtures for semiconductor structure fabrication, and systems for providing point-of-use enrichment of gas mixtures, are described herein. In an example, a system for fabricating a semiconductor structure includes a process chamber for processing a substrate of a semiconductor structure. A gas supply is coupled to the process chamber. A point-of-use gas enrichment module is coupled to the gas supply. The point-of-use gas enrichment module is configured to concentrate a first gas composition to provide a second gas composition to the gas supply for the process chamber. The second gas composition has a relative amount of a hydride species greater than a relative amount of corresponding hydride species in the first gas composition.

17 Claims, 6 Drawing Sheets

(56) References Cited

U.S. PATENT DOCUMENTS

| | | | |
|---|---|---|---|
| 4,364,759 A | 12/1982 | Brooks et al. | |
| 4,606,740 A | 8/1986 | Kulprathipanja | |
| 4,728,346 A | 3/1988 | Murphy | |
| 4,844,719 A | 7/1989 | Toyomoto et al. | |
| 5,336,298 A | 8/1994 | Quinn et al. | |
| 5,525,436 A | 6/1996 | Savinell et al. | |
| 5,997,821 A | 12/1999 | Josh | |
| 6,544,400 B2 | 4/2003 | Hockaday et al. | |
| 7,282,293 B2 | 10/2007 | Ren et al. | |
| 7,407,721 B2 | 8/2008 | Ren et al. | |
| 7,875,400 B2 | 1/2011 | Carlstrom et al. | |
| 2008/0220305 A1 | 9/2008 | Carlstrom et al. | |
| 2013/0032028 A1* | 2/2013 | Miyazawa | B01D 53/22 95/22 |
| 2014/0072836 A1* | 3/2014 | Mills | C25B 1/04 429/8 |
| 2018/0209051 A1* | 7/2018 | Baker | C25B 1/10 |

OTHER PUBLICATIONS

Holton, Oliver T., et al., "The Role of Platinum in Proton Exchange Membrane Fuel Cells", Platinum Metals Rev. 57(4), 2013, pp. 259-271.

Kluiters, S.C.A., "Status review on membrane systems for hydrogen separation", ECN-C-04-102, Intermediate report EU project MIGREYD NNES-2001-670 (2004), whole document.

Knox, Daniel, "Performance Characteristics of PBI-based High Temperature Direct Methanol Fuel Cells", Master's Thesis, Worcester Polytechnic Institute (2012), whole document.

Liu, Qingting, "Poly (2,5-benimidazole) based polymer electrolyte membranes for high temperature fuel cell applications", Doctoral thesis, Loughborough University, UK, 2010.

Moilanen, David E., et al., "Water Dynamics in Nafion Fuel Cell Membranes: the Effects of Confinement and Structural Changes on the Hydrogen Bond Network", Journal Phys. Chem. C Nanomater Interfaces, 111(25), 2007, whole document, doi: 10.1021/ip067460k.

Norby, Truls, et al., "Dense Ceramic Membranes for Hydrogen Separation", In "Nonporous Inorganic Membranes", Edited by A. F. Sammells and M. V. Mundschau (2006) WILEY-VCH Verlag GmbH & Co. KGaA, Weinheim, Germany, ISBN: 3-527-31342-7, whole document.

Oona, Yuka, "Study on Cell Performance and Durability of High-Temperature Proton Exchange Membrane Fuel Cells", Doctoral Dissertation, Daido University, Japan (2013), full document.

Perry, Kelly A., et al., "Electrochemical hydrogen pumping using a high-temperature polybenimidazole (PBI) membrane", Journal of Power Sources 177, 2008, pp. 478-484.

Ramani, Vijay, "Fuel Cells", The Electrochemical Society Interface, Spring 2006, pp. 41-44.

Seel, D.C., et al., "Chapter 19: High-temperature polybenimidazole-based membranes", Handbook of Fuel Cells—Fundamentals, Technology and Application, Edited by W. Vielstich et al., vol. 5: Advances in Electocatalysis, Materials, Diagnostics and Durability, 2009, John Wiley & Sons, Ltd., ISBN: 978-0-470-72311-1, whole document.

Sharma, Kal R., "Hydrogen Separation using Ternary Polymer Blend Compared with the Inorganic High Surface Area Zeolite Materials", Center for Computational Statistics, MS 4A7, Department of Applied and Engineering Statistics, George Mason University, Fairfax, VA 22030-4444, whole document.

Vogel, John, "Development of Polybenzimidazole-Based High-Temperature Membrane and Electrode Assemblies for Stationary and Automotive Applications", Plug Power Inc., Final Report prepared for U.S Dept. of Energy (2008), 2DE-FC-03G013101, whole document.

Xiao, Lixiang, et al., "High-Temperature Polybenimidazole Fuel Cell Membranes via a Sol-Gel Process", American Chemical Society, Chemical Mater 17, 2005, pp. 5328-5333.

\* cited by examiner

POINT-OF-USE ENRICHMENT OF GAS MIXTURES FOR SEMICONDUCTOR STRUCTURE FABRICATION AND SYSTEMS FOR PROVIDING POINT-OF-USE ENRICHMENT OF GAS MIXTURES

TECHNICAL FIELD

Embodiments of the present disclosure are in the field of renewable energy and, in particular, point-of-use enrichment of gas mixtures for semiconductor structure fabrication.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
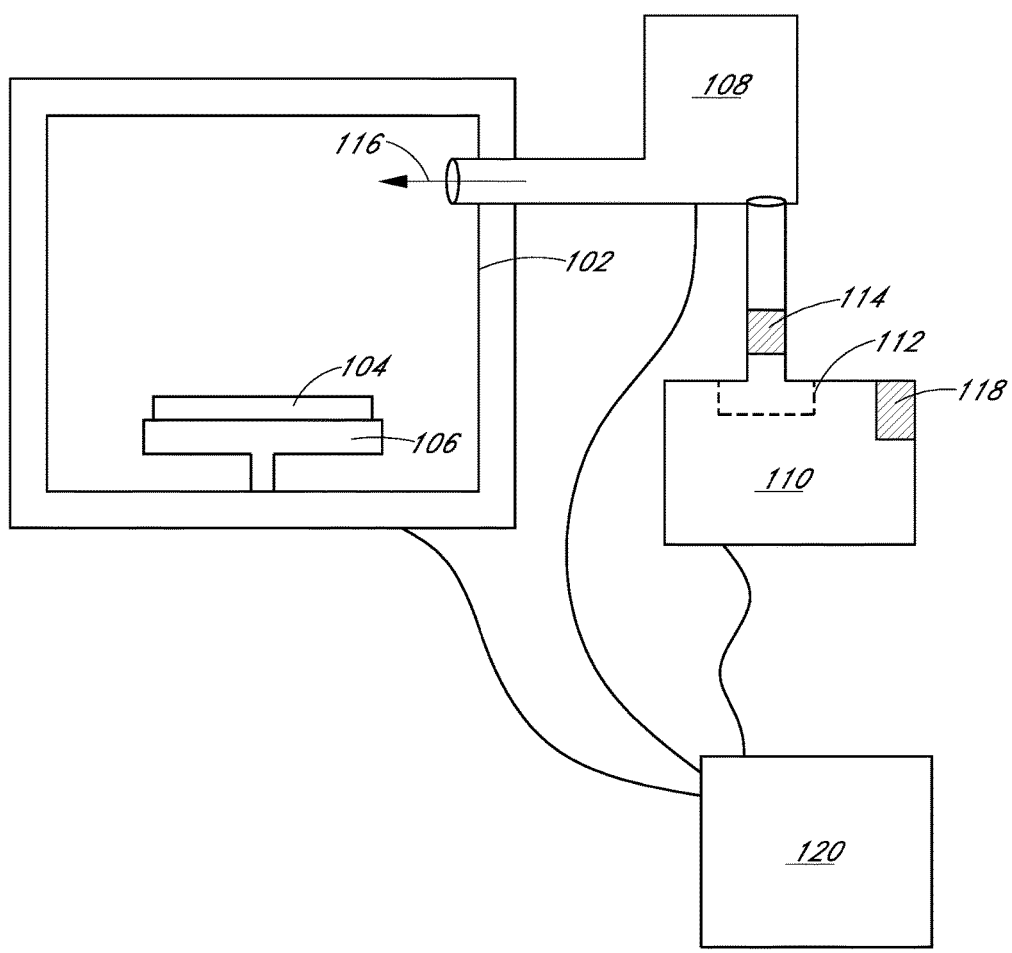
FIG. 1 illustrates a schematic of a system for fabricating a semiconductor structure, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for monitoring the fabrication of solar cell structures.

Point-of-use enrichment of gas mixtures for semiconductor structure fabrication, and systems for providing point-of-use enrichment of gas mixtures, are described herein. In the following description, numerous specific details are set forth, such as specific tooling configurations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are systems for fabricating semiconductor structures. In one embodiment, a system for fabricating a semiconductor structure includes a process chamber for processing a substrate of a semiconductor structure. A gas supply is coupled to the process chamber. A point-of-use gas enrichment module is coupled to the gas supply. The point-of-use gas enrichment module is configured to concentrate a first gas composition to provide a second gas composition to the gas supply for the process chamber. The second gas composition has a relative amount of a hydride species greater than a relative amount of corresponding hydride species in the first gas composition.

Also disclosed herein are methods of fabricating semiconductor structures. In one embodiment, a method of fabricating a semiconductor structure includes providing a first gas composition having a first total gas composition. The first gas composition has a first amount of a hydride species. The method also includes concentrating the first gas composition to provide a second gas composition having a second total gas composition. The second gas composition has a second amount of the hydride species. The second amount of the hydride species in the second gas composition, as relative to the second total gas composition, is greater than the first amount of the hydride species in the first gas composition, as relative to the first total gas composition. The method also includes using the second gas composition in the fabrication of a semiconductor structure.

In another embodiment, a method of fabricating a solar cell includes providing a first gas composition having a first total gas composition. The first gas composition has a first amount of diborane ($B_2H_6$). The first amount of diborane is of approximately 30% or less, as relative to the first total gas composition. The method also includes concentrating the first gas composition to provide a second gas composition having a second total gas composition. The second gas composition has a second amount of diborane. The second amount of diborane in the second gas composition is approximately 80% or more, as relative to the second total gas composition. The method also includes using the second gas composition in the fabrication of a solar cell.

One or more embodiments are directed to mitigating or eliminating issues associated with (1) a metastable gas that decomposes when contained and/or (2) caustic safety for delivery of reactant gases. Systems and approaches are described that allow for the removal of much of the hydrogen gas in a hydride-hydrogen gas mixture after it leaves a storage cylinder but immediately prior to its use in a process tool.

It is to be appreciated that many gas hydrides are toxic. Some are pyrophoric and most are flammable. To address concerns associated with handling such hazardous gases, gas companies have developed sub-atmospheric gas delivery systems such as Praxair's UpTime™ and Entegris' SDS and VAC™ cylinders. Such systems allow gases to exit the cylinder only when the pressure at the outlet is below atmospheric pressure. This is an excellent safety feature but it can be a very expensive feature. Typically these approaches are only used for pure hazardous hydrides or for mixtures that contain relatively high hazardous hydride concentrations (e.g., 10% or more). Furthermore, most of the available sub-atmospheric delivery systems are available only for small cylinders. Low concentrations of hazardous hydrides (e.g., 2% diluted in $H_2$ or inert gas) are usually delivered in conventional high pressure cylinders at a considerably lower cost per gram.

In accordance with one or more embodiments of the present disclosure, and addressing one or more of the above described issues, point-of-use concentration is implemented to boost hazardous hydride content in a safe, cost-effective manner. The end-user can control when and where the concentration is performed, the composition of the enriched mixture (e.g., up to approximately 100% of a hydride species) and the pressure at which the concentration occurs. Such a cost of safety advantage may be particularly valuable for cost-sensitive industries such as solar, flat panel display, semiconductor packaging, energy storage, etc.

As an exemplary semiconductor processing system, FIG. 1 illustrates a schematic of a system 100 for fabricating a semiconductor structure, in accordance with an embodiment of the present disclosure.

Referring to FIG. 1, system 100 includes a process chamber 102 for processing a substrate 104 of a semiconductor structure. In one embodiment, the substrate 104 is supported on a process support such as a chuck 106. A gas supply 108 is coupled to the process chamber 102. A point-of-use gas enrichment module 110 is coupled to the gas supply 108. The point-of-use gas enrichment module 110 is configured to concentrate a first gas composition to provide a second gas composition to the gas supply 108 for the process chamber 102. In an embodiment, as is described in greater detail below, the second gas composition has a relative amount of a hydride species greater than a relative amount of corresponding hydride species in the first gas composition.

In an embodiment, as is described in greater detail below, the point-of-use gas enrichment module 110 includes a semi-permeable membrane 112. In one such embodiment, the semi-permeable membrane 112 is permeable to a hydride species. In another embodiment, as is described in greater detail below, the point-of-use gas enrichment module 110 includes an electrochemical cell 114. In an embodiment, as is described in greater detail below, the point-of-use gas enrichment module 110 is configured to humidify the first gas composition, e.g., with humidifying module 118.

In an embodiment, the gas supply 108 is configured to provide the second gas composition to the process chamber 102 with a flow rate approximately in the range of 3-100 sccm, e.g., in direction 116. In one such embodiment, the second gas composition is supplied to the process chamber 102 with a flow rate approximately in the range of 10-50 sccm.

In an embodiment, system 100 includes or is coupled to an electronic system 120. The electronic system 120 can be directly or indirectly coupled to one or more of the process chamber 102, the gas supply 108 or the point-of-use gas enrichment module 110, and possibly other modules of or coupled to the system 100. In one embodiment, the electronic system 120 includes an electronic control system to control processing of the substrate 104. In some embodiments, additional electronics and/or software are incorporated into the electronic system 120.

Various components of the electronic system 120 and/or one or more portions of the disclosed techniques can be implemented by a processor unit executing program instructions stored on a memory. In various embodiments, the processor unit can include one or more processors or cores. The processor unit can contain a cache or other form of on-board memory. The memory is usable by the processor unit (e.g., to store instructions executable by and data used by the processor unit). The memory can be implemented by any suitable type of physical memory media, including hard disk storage, floppy disk storage, removable disk storage, flash memory, random access memory (RAM-SRAM, EDO RAM, SDRAM, DDR SDRAM, Rambus® RAM, etc.), ROM (PROM, EEPROM, etc.), and so on. The memory can consist solely of volatile memory in one embodiment. The circuitry can include an I/O interface configured to couple to and communicate with other devices (e.g., to receive a value representing the threshold voltage), according to various embodiments.

Articles of manufacture that store instructions (and, optionally, data) executable by a computer system to implement various techniques disclosed herein are also contemplated. These articles of manufacture include tangible computer-readable memory media. The contemplated tangible computer-readable memory media include portions of the memory subsystem of a computer system (without limitation SDRAM, DDR SDRAM, RDRAM, SRAM, flash memory, and various types of ROM, etc.), as well as storage media or memory media such as magnetic (e.g., disk) or optical media (e.g., CD, DVD, and related technologies, etc.). The tangible computer-readable memory media may be either volatile or nonvolatile memory.

More generally regarding point-of-use enrichment of gas mixtures, for reasons of economics, safety or long term stability, hydrogen is often added to a gas including a hydride species used in the manufacture of photovoltaic, semiconductor or display devices. The added hydrogen can often have a deleterious effect on a manufacturing process utilizing the hydride species. In accordance with an embodiment of the present disclosure, apparatuses and approaches are described for selective removal of hydrogen gas by use of a semi-permeable membrane and/or an electrochemical hydrogen pump operating in the electrolytic mode. The gas stream ultimately concentrated can improve the rate, yield, throughput or cost-effectiveness of the manufacturing process or the overall performance of the fabricated devices themselves.

To provide further context, the rate of decomposition of certain pure gases such as diborane ($B_2H_6$) depends on the concentration and pressure at which they are stored. In general, higher concentrations and higher storage pressures lead to more rapid decomposition rates. To mitigate such issues, it is common practice to dilute the metastable species in either an inert gas such as nitrogen or argon or one that serves to suppress the decomposition reaction. In the case of diborane, it is common practice to use compressed gas cylinders containing mixtures of up to 30% $B_2H_6$ in hydrogen, which suppresses the decomposition of diborane by the law of mass action since typical reaction products are higher boranes such as $B_5H_9$ and $B_{10}H_{14}$ and $H_2$ gas. It is to be appreciated that the above described dilution can be associated with unwanted consequences.

It is to be appreciated that, in some cases, it is possible to use other feeds for boron such as $BF_3$, $B_2F_4$ or solid boron. However, the fluorides can cause unwanted corrosion in the processing equipment. Additionally, hydrogen content in a source can be reduced by using solid borane sources, such as elemental boron (B), decaborane ($B_{10}H_{14}$) and octaborane ($B_8H_{12}$). These sources, however, are typically associated with low vapor pressures and it can be difficult to control the process.

Addressing one or more of the above issues, in accordance with one or more embodiments of the present disclosure, systems and approaches are described to allow for the removal of much of the hydrogen gas in a hydride-hydrogen gas mixture after it leaves a storage cylinder but immediately prior to its use in a process tool.

In a first aspect, a semi-permeable membrane is used to allow for the diffusion of hydrogen but not for the diffusion of a metal hydride. In an embodiment, a semi-permeable membrane separates two cavities. The hydride-hydrogen gas mixture flows through the first of these two cavities. The second cavity is connected to a vacuum system. Hydrogen from the first cavity crosses the semi-permeable membrane into the second cavity, is removed by the vacuum pump(s), and is safely exhausted by a suitable abatement system.

In a second aspect, an electrochemical cell that employs a hydrogen electrolyte is used to electrochemically remove hydrogen from the mixed gas feed. In an embodiment, part of or all of the boundary between a first and second cavity includes an electrochemical cell similar in structure to a fuel cell with a membrane known to act as a hydrogen electrolyte at ambient temperatures. Such membrane materials may include proton exchange membranes (PEMs). It is to be appreciated that the preferred electrolyte material in state of the art fuel cells is the Nafion ionomer but other materials are in development. Many of these materials are, like Nafion, polymeric in nature. However, a family of electrolytes based on metal-organic frameworks are currently under development and may eventually replace the polymeric electrolytes used today. One potential drawback of using Nafion is the need to control the relative humidity of its environment, although this is relatively easily performed in a fuel cell by humidifying the feed gases since water is also produced at the oxygen electrode of a fuel cell by the reaction between hydrogen and oxygen. By contrast, in accordance with one or more embodiments described herein, the use of Nafion as a PEM requires carefully managed humidity control of the first and second cavities to avoid desiccation of the ionomer. In alternative embodiments, PEMs based on materials such as polybenzimidazole (PBI) which can operate without the need for humidity control are used in a hydride concentrator.

Figure 2:
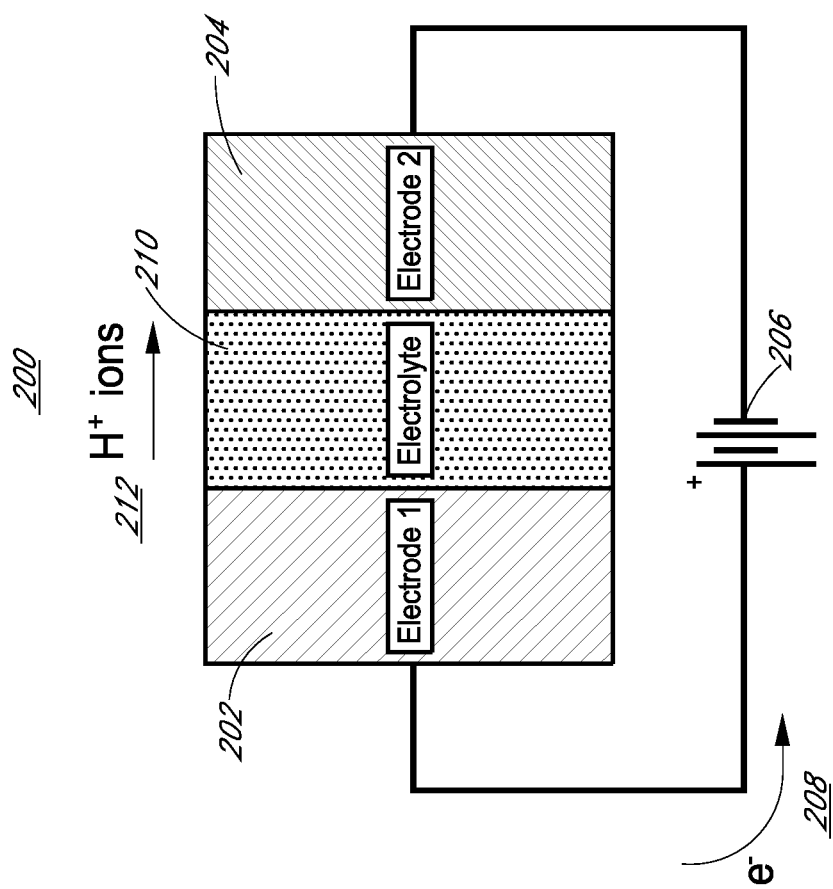
FIG. 2 is a schematic of an electrical circuit of a gas cell, in accordance with an embodiment of the present disclosure.

As an exemplary cell using a semi-permeable membrane, FIG. 2 is a schematic of an electrical circuit 200 of a gas cell, in accordance with an embodiment of the present disclosure.

Referring to FIG. 2, electrode 1 (202) and electrode 2 (204) are connected electrically to a power supply 206 capable of driving DC current 208 through the circuit 200. Typically, electrode 1 is configured as the anode (positive electrode) and electrode 2 is configured as the cell cathode (negative electrode).

A porous composite included in a first cavity and a porous composite included in a second cavity are separated by a membrane of material known to act as an electrolyte 210 for hydrogen ions 212. The membrane can be gas tight but upon application of an electric potential between electrode 1 and electrode 2, hydrogen gas can be transported across this membrane due to the half-cell reactions that take place at each electrode: at electrode 1, $H_2 (g) = 2H^+ + 2e^-$; at electrode 2, $2H^+ + 2e^- = H_2 (g)$.

Accordingly, hydrogen ions are transported electrochemically across the membrane electrolyte 210 and electrons traverse the external circuit 200 driven by the power supply 206. In this way, hydrogen gas is electrochemically pumped from a region of high hydrogen partial pressure (e.g., the hydride-hydrogen gas mixture) to a region of low hydrogen partial pressure (e.g., an inert gas ballast flow or pumped region, not shown in FIG. 2).

In an embodiment, a hydride-hydrogen gas mixture flows through a first cavity in communication with a surface of an anode material (electrode 1). The anode can include a porous composite containing an electronic conductor and a solid electrolyte material. The electronic conductor can be Pt, an alloy of Pt such as $Pt_3Ni$ or Pt—Ru, Pt—$CeO_2$ mixtures, carbon nanotubes, etc.

In an embodiment, a second cavity is maintained at approximately the same pressure as the first cavity. This can be achieved by a ballast flow of inert gas such as nitrogen or argon or by the use of a suitable vacuum pump. One or more surfaces of the second cavity is a material of similar composition to that in communication with the first cavity, e.g., a porous composite containing an electronic conductor and a solid electrolyte material (electrode 2).

Figure 3:
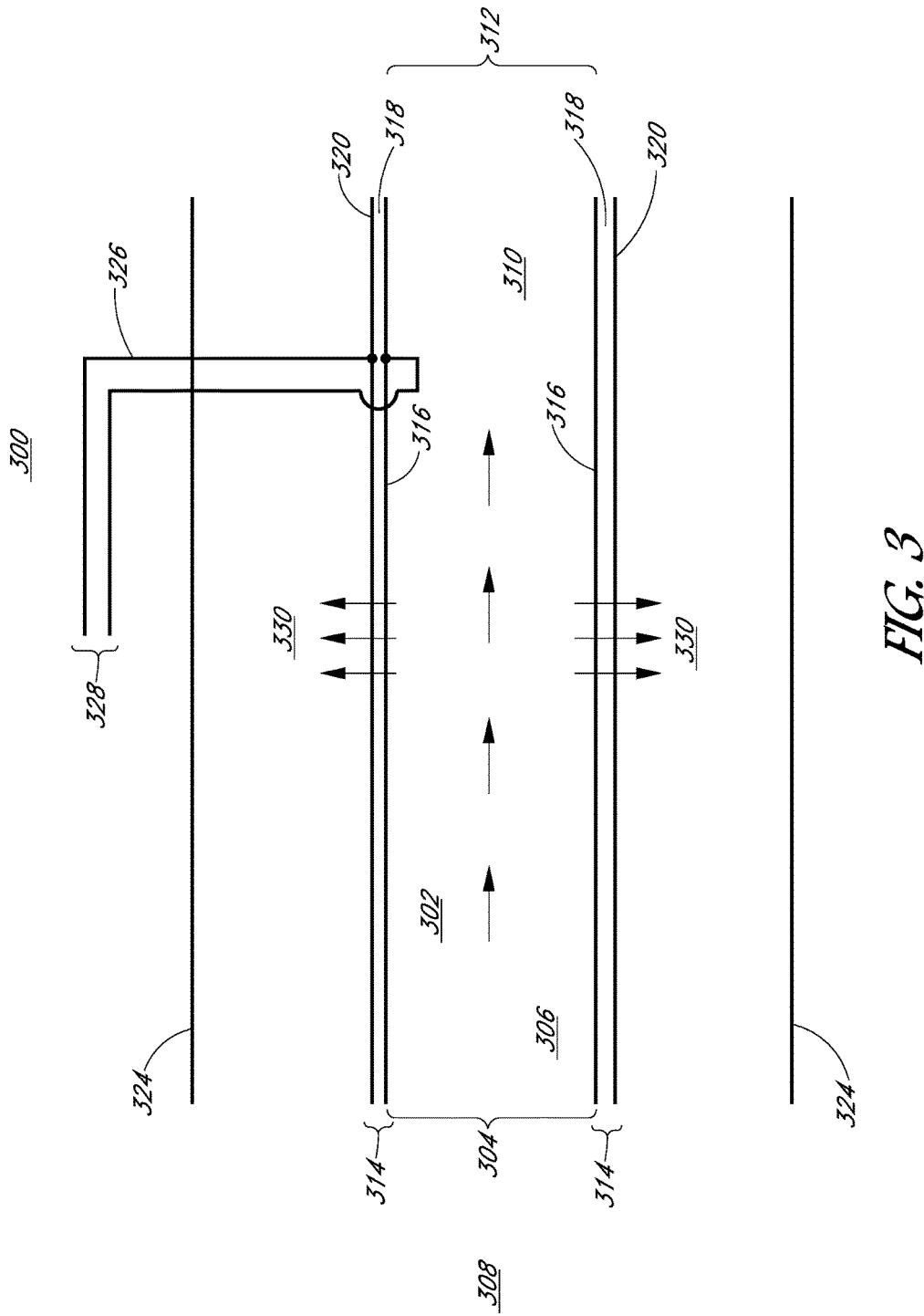
FIG. 3 illustrates a cross-sectional view of a concentric arrangement for an electrochemical hydrogen pump, in accordance with an embodiment of the present disclosure.

As an exemplary electrochemical cell-based system, FIG. 3 illustrates a cross-sectional view of a concentric arrangement for an electrochemical hydrogen pump, in accordance with an embodiment of the present disclosure.

Referring to FIG. 3, an electrochemical pumping apparatus 300 includes a cavity 302. The cavity 302 includes a tubular shaped member 304 connected at its upstream end 306 to a hydride-hydrogen gas mixture supply 308. The tubular shaped member 304 is connected at its downstream end 310 to a tool gas cabinet 312.

A cylindrical wall 314 surrounds cavity 302. In an embodiment, the cylindrical wall 314 includes three layers arranged concentrically: an inner porous electrode layer 316 in physical and electrical contact with the hydride-hydrogen gas mixture, an outer porous electrode layer 320 in physical and electrical contact with a cavity 330, and a membrane electrolyte 318 that separates the two electrode layers 316 and 320 physically and electrically.

Cavity 330 concentrically surrounds cavity 302. The outer surface 324 of cavity 330 is typically a metal tube (e.g., a stainless steel tube) of sufficient thickness to prevent rupture if an overpressure situation occurred. Cavity 330 is connected axially to a ballast flow of inert gas or a vacuum pump (not shown). Also not shown, but included in an embodiment, is a pressure sensor and feedback control circuit that ensures that the pressure differential between cavity 302 and cavity 330 does not reach a value suitable to rupture the membrane electrolyte.

Referring again to FIG. 3, an electrical feedthrough 326 in the outer wall 324 of cavity 330 connects two wires from an external DC power supply 328 to the electrodes 316 and 320. In an exemplary arrangement, the wire that connects to the inner electrode is electrically insulated where it is routed through the outer electrode and through the membrane electrolyte. As current flows from the inner electrode to the outer electrode, hydrogen (shown as vertical arrows in FIG. 3) is electrochemically pumped from the inner tube (cavity 302) to the outer tube (cavity 330) where it then flows to a suitable abatement system. In an alternative embodiment, cavity 302 and cavity 330 are interchanged such that cavity 302 forms the outer concentric tube and cavity 330 forms the inner concentric tube.

It is to be appreciated that the electrode/electrolyte/electrode tri-layer arrangement can also be configured as a planar, spherical or contoured surface. In an embodiment, the electrochemical cell 300 is tubular, spherical, prismatic, or one or both tubes can be coiled.

Providing further context, as described above, the most common membrane electrolyte used in contemporary hydrogen fuel cells is Nafion. However, in a point-of-use gas enrichment system or approach, different considerations apply from the typical requirements of a fuel cell. For example, a fuel cell is used to produce power from the electrochemical reaction of the fuel (hydrogen) with an oxidizer such as air or oxygen. By contrast, in accordance with one or more embodiments of the present disclosure, there is no requirement for the cell to produce power. In particular, cells described herein can be run in an electrolytic mode rather than a galvanic mode. Furthermore, the presence of oxygen gas may need to be avoided in gas lines containing reactive hydrides and hydrogen.

Additionally, it may be the case that fuel cells are operated under conditions where the water produced is vaporized as steam. In the absence of oxygen, however, no steam is produced and there is no need to run the electrochemical system at elevated temperatures. Furthermore, in accordance with one or more embodiments of the present disclosure, for reactive, metastable gases such as diborane, temperatures above 80 degrees Celsius are avoided to prevent the onset of thermal decomposition of pure $B_2H_6$ at reduced pressures. Also, reducing the operating temperature of the pump can reduce the current flow through a given thickness of electrolyte at a given voltage, reducing the hydrogen removal rate. However, in an embodiment, these issues are compensated for by increasing the effective surface area of the pump.

In one specific embodiment, a cell running at a current density of 0.2 $A \cdot cm^{-2}$ pumps $0.2 \times 1/96,485 \times 1/2 (\approx 1E-6)$ moles of hydrogen per second per $cm^2$. This is equivalent to approximately 2.32E-5 standard liters of hydrogen per second per $cm^2$ or approximately 1.4 sccm per $cm^2$ of electrode area. Thus a flowing gas stream containing about 25 sccm of hydrogen requires a cell area of approximately 18 $cm^2$ to electrochemically remove most of this hydrogen from a mixed hydride-hydrogen feed at an operating current density of 0.2 $A \cdot cm^{-2}$. The conductivity of a phosphoric acid-impregnated polybenzimidazole (PBI) membrane is about 0.01 $S \cdot cm^{-1}$ at 25° C. For a membrane 200 microns thick, operating at 0.2 $A \cdot cm^{-2}$, the ohmic losses across the electrolyte amount to ~400 mV. Under such conditions, an applied voltage of approximately 59 mV at 25° C. is sufficient to pump approximately 99% of the hydrogen from the feed gas stream in cavity 302 across the PEM to cavity 330 (with the exemplary reference of the system of FIG. 3). In an embodiment, once reduced to less than 1% of the total mixed hydride-hydrogen gas flow, the residual hydrogen gas has a minimal impact on the process.

In accordance with one or more embodiments of the present disclosure, a further advantage of the electrochemical method described herein is the ability to control the partial pressure of hydrogen in the mixed gas stream. For example, in one embodiment, the partial pressure of hydrogen in the mixed gas stream can be regulated by carefully controlling the voltage applied to the electrochemical cell, adjusting the rate of hydrogen transport across the membrane. Such control can be achieved by calculating the equilibrium constant for the required partial pressure of hydrogen using the Nernst Equation and setting the appropriate cell voltage. Suitable partial pressure sensors can also be used in conjunction with a feedback control circuit to adjust the concentration of hydrogen in the mixture exiting the electrochemical cell region.

Providing further context, Nafion-based PEMs have a higher conductivity than phosphoric-acid impregnated PBI membranes at ambient temperatures but, as described above, require humidification of the feed gases. Since some hydride gases can react with water, this can be problematic. Also, some manufacturing processes are sensitive to moisture content. Thus, the use of a Nafion-based PEM in an electrochemical hydrogen pump may require special considerations.

In accordance with an embodiment of the present disclosure, a mixed hydride-hydrogen feed gas is humidified immediately prior to flowing through cavity 302 of the electrochemical hydrogen pump, using FIG. 3 as the exemplary system, addressing the need for humidity control. If necessary, the concentrated hydride gas can then be desiccated, either by flowing through conventional desiccants such as molecular sieves, silica gel, phosphorus pentoxide, etc., or by flowing through a Nafion drying system.

Water can be added to a stream of mixed hydride-hydrogen gas by several methods. In one embodiment, for hydrides that do not react with water, the gas stream can be bubbled through a reservoir of water maintained at a constant temperature, controlling the relative humidity in cavity 302. For hydrides that dissolve in or react with water, such a method is likely unsuitable. In these cases, in an embodiment, water is injected into cavity 302 independent of the mixed hydride-hydrogen gas feed. This can be performed in any of several ways: by the use of a water bubbler through which a suitable carrier gas, e.g., $N_2$, Ar or even $H_2$ is flowed, as steam, as fine water droplets using an ultrasonic nozzle, or by pumping on a reservoir of water maintained at a constant temperature through a suitable valve with a conductance that can be controlled (e.g., a needle valve, a variable leak valve, a mass flow controller, a vapor delivery system, etc.).

Figure 4:
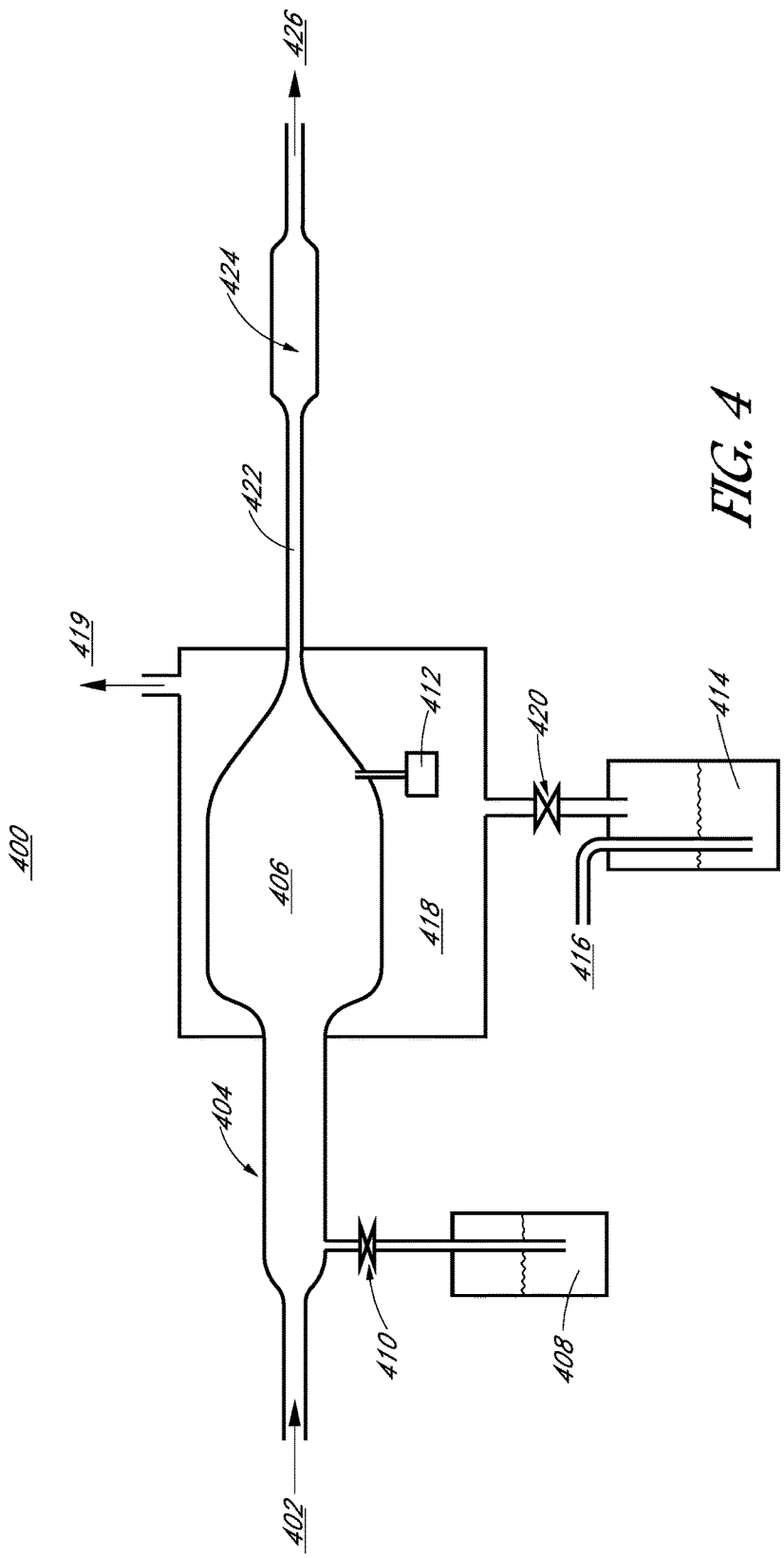
FIG. 4 illustrates a schematic of an apparatus for humidifying a mixed hydride-hydrogen gas stream, electrochemically removing hydrogen gas to concentrate the hydride and then drying the concentrated hydride gas, in accordance with an embodiment of the present disclosure.

As an exemplary system providing humidifying capability, FIG. 4 illustrates a schematic of an apparatus 400 for humidifying a mixed hydride-hydrogen gas stream, electrochemically removing hydrogen gas to concentrate the hydride and then drying the concentrated hydride gas, in accordance with an embodiment of the present disclosure.

Referring to FIG. 4, a hydride-hydrogen gas mixture 402 flows from a gas cylinder through a suitable regulator and valves (not shown) to a mixing tube 404 immediately upstream of a cavity 406 of the electrochemical hydrogen pump. At 404, water vapor from water reservoir 408 is admitted through a control valve 410. The control valve 410 can operate as a simple open/close valve or it can also perform a metering function. Alternatively, the metering function can be provided by one or more additional valves in series with the open/close valve. In any case, in this way, the mixed hydride-hydrogen feed gas is humidified. The relative humidity of the gas in cavity 406 is monitored using a humidity sensor 412. The signal from this sensor is fed to a controller that in turn is used to open or close the valve 410 between the water vapor supply 408 and/or to adjust the metering valve. In this way, the relative humidity of the mixed gas stream in cavity 406 can be carefully controlled. By also adding water vapor from water reservoir 414 to an inert gas ballast 416 flowing through cavity 418, a Nafion membrane can be humidified from opposing surfaces. Further control can be achieved through control valve 420 with metering capability. Also, cavity 418 can be coupled to exhaust 419.

After passing through cavity 406 of the electrochemical hydrogen pump, the gas feed, now containing added moisture but depleted of hydrogen, flows through a length of tubing 422 before it passes through a drying apparatus 424. The flow then continues to a gas line 426 directed to a process tool.

In an embodiment, the drying apparatus 424 utilizes a drying operation performed at a temperature below that at which a hydride gas will decompose. Any drying agent used can be selected as to not react with the hydride gas. An example of a suitable gas drying apparatus is a length of tubing fabricated from Nafion selectively permeable membrane. In one embodiment, the tubing is designed to remove only water vapor from gas sample streams. Such systems may operate on the principle that water vapor is transported from the wet gas stream across a Nafion semi-permeable membrane to a dry gas stream flowing on the other side of the semi-permeable membrane and can reduce the dew point of the sample stream to values as low as $-60°$ C.

Figure 5:
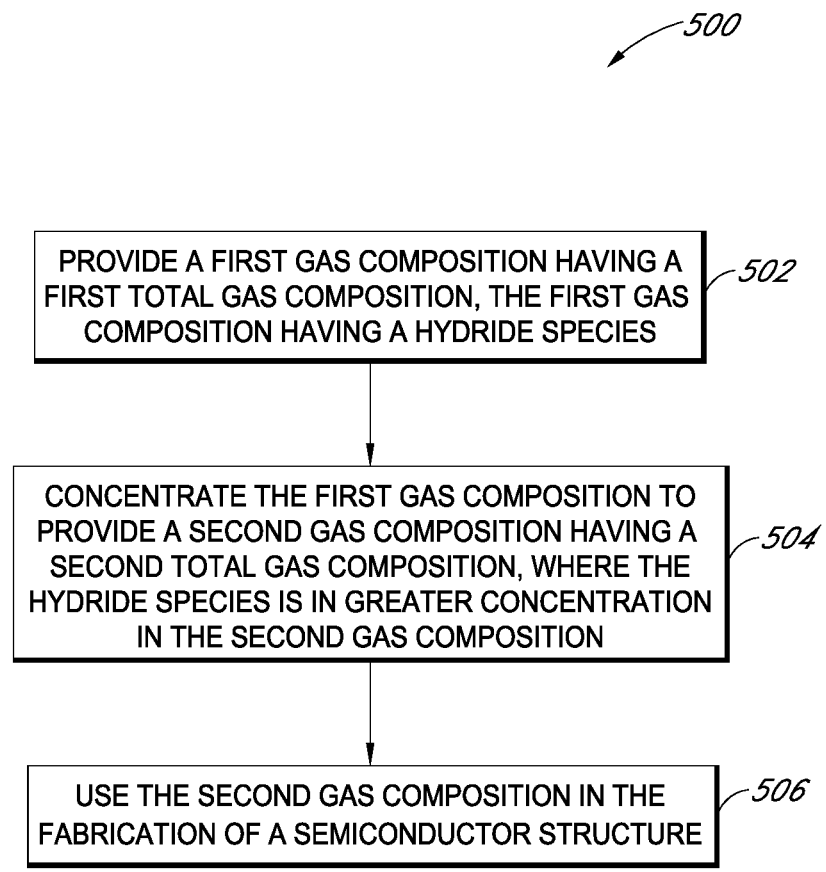
FIG. 5 is a flowchart listing operations in a method of fabricating a semiconductor structure, in accordance with an embodiment of the present disclosure.

In another aspect, methods are described which involve the point-of-use preparation of a concentrated gaseous hydride sample. As an example, FIG. 5 is a flowchart 500 listing operations in a method of fabricating a semiconductor structure, in accordance with an embodiment of the present disclosure.

Referring to operation 502 of flowchart 500, a method of fabricating a semiconductor structure includes providing a first gas composition having a first total gas composition. The first gas composition has a first amount of a hydride species. Referring to operation 504 of flowchart 500, the method also includes concentrating the first gas composition to provide a second gas composition having a second total gas composition. The second gas composition has a second amount of the hydride species. The second amount of the hydride species in the second gas composition, as relative to the second total gas composition, is greater than the first amount of the hydride species in the first gas composition, as relative to the first total gas composition. Referring to operation 506 of flowchart 500, the method also includes using the second gas composition in the fabrication of a semiconductor structure.

In an embodiment, the hydride species is selected from the group consisting of diborane ($B_2H_6$), phosphine ($PH_3$), arsine ($AsH_3$), silane ($SiH_4$), disilane ($Si_2H_6$), and stibine ($SbH_3$). In one embodiment, the concentrated gas is a hazardous process gas, such as a toxic, flammable, pyrophoric, or metastable process gas which is concentrated immediately prior to use in a manufacturing process. In an embodiment, the semiconductor structure is selected from the group consisting of a solar cell, an integrated circuit, a light-emitting diode, a display, and a battery.

In a particular embodiment, the hydride species is diborane ($B_2H_6$). Concentrating the first gas composition to provide the second gas composition involves concentrating from the first amount of diborane of approximately 30% or less as relative to the first total gas composition to the second amount of diborane of approximately 50% or more (and in some embodiments, as much as 80% or more) as relative to the second total gas composition.

In another particular embodiment, the hydride species is phosphine ($PH_3$). Concentrating the first gas composition to provide the second gas composition involves concentrating from the first amount of phosphine of approximately 5% or less as relative to the first total gas composition to the second amount of phosphine of approximately 50% or more as relative to the second total gas composition.

In an embodiment, concentrating the first gas composition to provide the second gas composition involves introducing the first gas composition to a semi-permeable membrane. The semi-permeable membrane is permeable to the hydride species. It is to be appreciated that, more generally, semi-permeable membranes allow the preferential passage of some species. In one embodiment, a membrane is selected that has substantially different rates of permeation for the relevant hydride species and the diluent gas(es). For example, in one embodiment, the first gas composition further includes a first amount of hydrogen ($H_2$), and the semi-permeable membrane is further permeable to the first amount of hydrogen but with a different permeation rate from the hydride species.

In an embodiment, the first amount of hydrogen and the first amount of the hydride species are substantially separated from one another using vacuum separating subsequent to introducing the first gas composition to the semi-permeable membrane. It is to be appreciated that in the molecular flow regime, the rate of diffusion of hydrogen can be faster than the rate of diffusion of hydride by the square root of their relative molar masses. Using a vacuum pump to pump across a semi-permeable membrane that is permeable to both hydride and hydrogen can be used to remove proportionally more hydrogen from the initial mixture. In one such embodiment, the rate of permeation across the membrane for hydrogen is significantly larger than the rate of permeation of hydride species. In a particular embodiment, at least a portion of the first amount of hydrogen separated from the first amount of the hydride species is recycled.

In an embodiment, concentrating the first gas composition to provide the second gas composition involves introducing the first gas composition to an electrochemical cell. That is, a gaseous hydride mixture can be brought into contact with the cell and protons are pumped across the cell in "electrolytic" mode. In one such embodiment, the first gas composition further includes a first amount of hydrogen ($H_2$), and the electrochemical cell removes a substantial portion of the first amount of hydrogen. In effect, hydrogen is transported (or electrochemically pumped) across the electrochemical cell. Protons (hydrogen ions) are transported across the electrolyte of the cell and electrons are forced through the external circuit by an applied potential (voltage).

In an embodiment, concentrating the first gas composition to provide the second gas composition involves first humidifying the first gas composition. It is to be appreciated that humidifying the gas may only be required if electrochemical hydrogen removal is used in a low temperature Nafion-based fuel cell.

In an embodiment, using the second gas composition in the fabrication of the semiconductor structure involves flowing the second gas composition with a flow rate approximately in the range of 3-100 sccm. In a particular embodiment, the second gas composition is flowed with a flow rate approximately in the range of 10-50 sccm.

Figure 6:
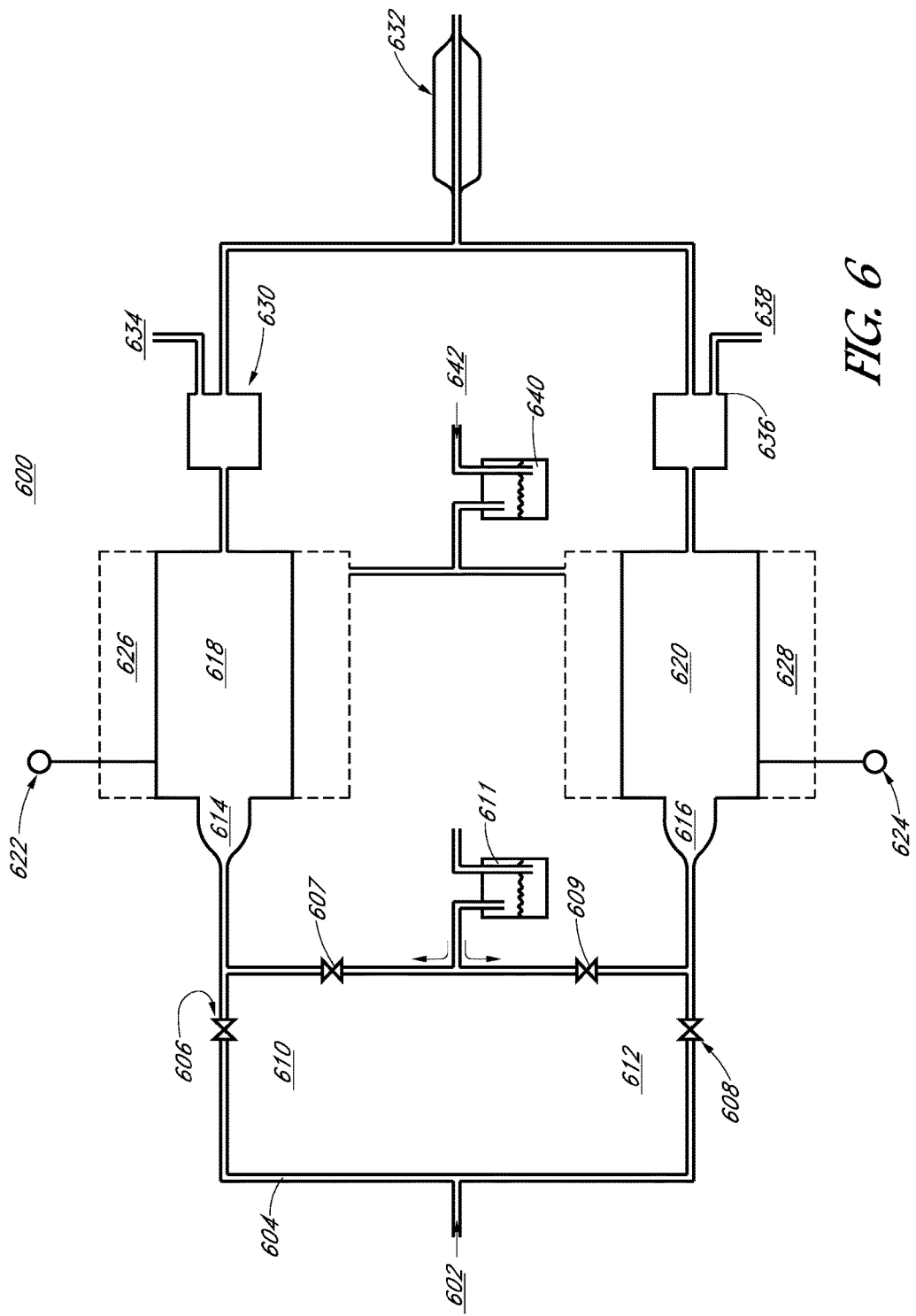
FIG. 6 illustrates a schematic of an apparatus for humidifying a mixed hydride-hydrogen gas stream, in accordance with another embodiment of the present disclosure.

In another approach, FIG. 6 illustrates a schematic of an apparatus 600 for humidifying a mixed hydride-hydrogen gas stream, in accordance with another embodiment of the present disclosure.

Referring to FIG. 6, a hydride-hydrogen gas mixture 602 is flowed from a gas cylinder through a suitable regulator and valves (not shown) to a plenum 604 that contains two or more valves. For example, the valves can include a first plenum isolation valve 606 and a second plenum isolation valve 608. First and second control valves 607 and 609 are coupled to a humidifying source 611. The valves 606, 607, 608 and 609 serve to isolate the upstream gas line from humidifying modules, such as a first humidifying module 610 and a second humidifying module 612, first and second mixing tubes 614 and 616 and electrochemical hydrogen pumps located downstream.

On the downstream side of the plenum 604, each of the humidifying modules 610 and 612 includes a control valve 607 and 609, respectively, connected on the upstream side to a supply of water vapor and on the downstream side to the mixing tube 614 and 616, respectively. The control valve can operate as a simple open/close valve or it can also perform a metering function. Alternatively, the metering function can be provided by one or more additional valves in series with the open/close valve. In this way, the mixed hydride-hydrogen feed gas is humidified prior to passing through first and second primary cavities 618 and 620, respectively. The relative humidity of the gas in each cavity 618 and 620 is monitored using a corresponding humidity sensor 622 or 624, respectively. The signal from the sensor is fed to a controller that in turn is used to open or close the valve between the water vapor supply and/or to adjust the metering valve connected to the first and second primary cavities 618 and 620. In this way, the relative humidity of the mixed gas stream in each of the first and second primary cavities 618 and 620 can be carefully controlled. By also adding water vapor to an inert gas ballast flowing through a corresponding secondary cavity 626 or 628, respectively, a Nafion membrane can be humidified from opposing surfaces.

Referring again to FIG. 6, and in particular to plenum isolation valve 606 and connected manifold 614, when the isolation valve 606 is in the closed position, it is possible to flow a gas stream saturated with water vapor to hydrate the Nafion PEM in cavity 618. By also adding water vapor to the inert gas ballast flowing through cavity 626, e.g., from humidifier 640 with inert ballast 642, a Nafion membrane can be humidified from opposing surfaces. Switching valve 630 is located downstream of cavity 618. When the hydride-hydrogen gas mixture is flowing through cavity 618, switching valve 630 directs the flow exiting the switching valve 630 to a drying apparatus 632. When the gas stream saturated with water vapor is flowing through cavity 618, switching valve 630 directs the flow exiting the switching valve 630 to an exhaust manifold 634.

Referring to plenum isolation valve 608 and connected manifold 616, when the isolation valve 608 is in the closed position, it is possible to flow a gas stream saturated with water vapor to hydrate a Nafion PEM in cavity 620. By also adding water vapor to the inert gas ballast flowing through cavity 628 with inert ballast 642, e.g., from humidifier 640, a Nafion membrane can be humidified from opposing surfaces. Switching valve 636 is located downstream of cavity 620. When the hydride-hydrogen gas mixture is flowing through cavity 620, switching valve 636 directs the flow exiting the switching valve 636 to a drying apparatus 632. When the gas stream saturated with water vapor is flowing through cavity 620, switching valve 636 directs the flow exiting the switching valve 636 to an exhaust manifold 638.

It is to be appreciated that there may be advantages to hydrating the Nafion PEM during the time that the plenum isolation valve is closed and the mixed hydride-hydrogen gas feed is not flowing through cavity 618 or 620. For example, some hydride gases react with water or are water soluble. It may be preferable to run a hydride-hydrogen gas mixture containing a water soluble or water reactive hydride without humidifying. In such cases, the Nafion PEM can slowly lose water over time and its ionic conductivity may fall, reducing its ability to pump hydrogen. By periodically interrupting the flow of dry gas to introduce wet gas, the Nafion PEM can be maintained in its hydrated state. Since the ionic conductivity of Nafion is dependent on its state of hydration, by monitoring the voltage across the electrochemical hydrogen pump and the current in the circuit during the time that the mixed hydride-hydrogen gas stream is flowing through cavity 618 or 620, the conductivity ($\kappa$) can be calculated from the relationship: $\kappa=I*t/(V*A)$, where $\kappa$ is the ionic conductivity of the Nafion PEM expressed in $Scm^{-1}$, I is the current through the cell expressed in amperes, t is the thickness of the Nafion PEM expressed in cm, V is the voltage across the cell expressed in volts, and A is the surface area of the electrochemical hydrogen pump expressed in $cm^2$.

In an embodiment, when the current flowing at a given voltage drops below a pre-determined threshold, the dry gas feed to cavity 618 or 620 is interrupted by closing the associated plenum isolation valve and a wet gas feed is introduced through the corresponding control valve. After a short delay, the corresponding switching valve changes state to direct the wet gas feed flowing through cavity 618 or 620 to the exhaust. During the time that the Nafion PEM in cavity 618 or 620 is being re-hydrated, dry hydride-hydrogen gas mixture flows through the other cavity 618 or 620. By using a plurality of cavities, it can be possible to avoid the need to humidify the hydride-hydrogen gas feed. While dry mixed hydride-hydrogen gas is flowing through one of a plurality of electrochemical hydrogen pumps arranged in parallel to one another, the remaining electrochemical hydrogen pumps can be re-hydrated by a flow of wet gas. By using a suitable control system to open and close the plenum isolation valves and to change the state of the switching valves, a continuous flow of enriched hydride gas can be maintained. The resultant flow is then passed through a drying apparatus to remove any moisture that it may have accumulated when coming into contact with a Nafion PEM.

Embodiments described above may be implemented to concentrate the hydride content of mixed hydride-hydrogen gas feeds for subsequent use in the photovoltaic, semiconductor or display manufacturing, etc., industries. Embodiments may be particularly useful for deposition applications (e.g., chemical vapor deposition, plasma-enhanced chemical vapor deposition, metalorganic chemical vapor deposition, reactive sputtering, reactive evaporation, reactive ion beam deposition, metalorganic molecular beam epitaxy, atomic layer epitaxy, atomic layer deposition, plasma-assisted atomic layer deposition, etc.) when, for reasons of economy, safety or long term stability, a hydride gas must be stored as a mixture with added hydrogen. Approaches described herein can be implemented to remove hydrogen from other gas mixtures that may contain one or more gases in addition to hydrogen; such mixtures may or may not contain one or more hydride gases.

Although certain modules or materials are described specifically with reference to above described embodiments, some modules or materials may be readily substituted with others with such embodiments remaining within the spirit and scope of embodiments of the present disclosure. Embodiments disclosed herein may be suitable for semiconductor structures, such as solar cells, based on a silicon substrate or solar cells based on a different material substrate, such as a group III-V material substrate. Embodiments disclosed herein may be suitable for solar cells having back side alternating N+ type and P+ type emitter regions, or for other solar cell arrangements, such as front contact solar cell arrangements. In other embodiments, the above described approaches can be applicable to manufacturing of articles other than solar cells. For example, manufacturing of light emitting diode (LEDs), or other structures as described above, may benefit from approaches described herein.

Thus, point-of-use enrichment of gas mixtures for semiconductor structure fabrication, and systems for providing point-of-use enrichment of gas mixtures, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a semiconductor structure, the method comprising:
    a process chamber for processing a substrate of a semiconductor structure;
    a gas supply coupled to the process chamber; and
    a point-of-use gas enrichment module coupled to the gas supply, the point-of-use gas enrichment module configured to concentrate a first gas composition to provide a second gas composition to the gas supply for the process chamber, the second gas composition having a relative amount of a hydride species greater than a relative amount of corresponding hydride species in the first gas composition.

2. The system of claim 1, wherein the point-of-use gas enrichment module comprises a semi-permeable membrane, the semi-permeable membrane permeable to the hydride species.

3. The system of claim 1, wherein the point-of-use gas enrichment module comprises an electrochemical cell.

4. The system of claim 1, wherein the gas supply is configured to provide the second gas composition to the process chamber with a flow rate approximately in the range of 3-100 sccm.

5. The system of claim 1, wherein the point-of-use gas enrichment module is configured to humidify the first gas composition.

6. The system of claim 1, wherein the hydride species is selected from the group consisting of diborane ($B_2H_6$), phosphine ($PH_3$), arsine ($AsH_3$), silane ($SiH_4$), disilane ($Si_2H_6$), and stibine ($SbH_3$).

7. The system of claim 1, wherein the semiconductor structure is selected from the group consisting of a solar cell, an integrated circuit, a light-emitting diode, a display and a battery.

8. The system of claim 1, wherein the hydride species is phosphine ($PH_3$), and the first gas composition has a first amount of phosphine of approximately 5% or less, and the second gas composition has a second amount of phosphine of approximately 50% or more.

9. The system of claim 1, wherein the hydride species is diborane ($B_2H_6$), and the first gas composition has a first amount of diborane of approximately 30% or less, and the second gas composition has a second amount of diborane of approximately 80% or more.

10. A system for fabricating a semiconductor structure, the system comprising:
 a process chamber for processing a substrate of a semiconductor structure;
 a gas supply coupled to the process chamber; and
 a point-of-use gas enrichment module coupled to the gas supply, the point-of-use gas enrichment module configured to concentrate a first gas composition to provide a second gas composition to the gas supply for the process chamber, the second gas composition having a relative amount of a hydride species greater than a relative amount of corresponding hydride species in the first gas composition, wherein the point-of-use gas enrichment module comprises a semi-permeable membrane, the semi-permeable membrane permeable to the hydride species, and wherein the hydride species is selected from the group consisting of diborane ($B_2H_6$), phosphine ($PH_3$), arsine ($AsH_3$), silane ($SiH_4$), disilane ($Si_2H_6$), and stibine ($SbH_3$).

11. The system of claim 10, wherein the gas supply is configured to provide the second gas composition to the process chamber with a flow rate approximately in the range of 3-100 sccm.

12. The system of claim 10, wherein the point-of-use gas enrichment module is configured to humidify the first gas composition.

13. The system of claim 10, wherein the semiconductor structure is selected from the group consisting of a solar cell, an integrated circuit, a light-emitting diode, a display and a battery.

14. A system for fabricating a semiconductor structure, the system comprising:
 a process chamber for processing a substrate of a semiconductor structure;
 a gas supply coupled to the process chamber; and
 a point-of-use gas enrichment module coupled to the gas supply, the point-of-use gas enrichment module configured to concentrate a first gas composition to provide a second gas composition to the gas supply for the process chamber, the second gas composition having a relative amount of a hydride species greater than a relative amount of corresponding hydride species in the first gas composition, wherein the point-of-use gas enrichment module comprises an electrochemical cell, and wherein the hydride species is selected from the group consisting of diborane ($B_2H_6$), phosphine ($PH_3$), arsine ($AsH_3$), silane ($SiH_4$), disilane ($Si_2H_6$), and stibine ($SbH_3$).

15. The system of claim 14, wherein the gas supply is configured to provide the second gas composition to the process chamber with a flow rate approximately in the range of 3-100 sccm.

16. The system of claim 14, wherein the point-of-use gas enrichment module is configured to humidify the first gas composition.

17. The system of claim 14, wherein the semiconductor structure is selected from the group consisting of a solar cell, an integrated circuit, a light-emitting diode, a display and a battery.

* * * * *